(12) United States Patent
    Stroet

(10) Patent No.: US 9,106,202 B2
(45) Date of Patent: Aug. 11, 2015

(54) POLY-PHASE FILTER WITH PHASE TUNING

(71) Applicant: Linear Technology Corporation, Milpitas, CA (US)

(72) Inventor: Petrus M. Stroet, Santa Cruz, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/189,652

(22) Filed: Feb. 25, 2014

(65) Prior Publication Data

US 2014/0312989 A1     Oct. 23, 2014

Related U.S. Application Data

(60) Provisional application No. 61/813,077, filed on Apr. 17, 2013.

(51) Int. Cl.
    *H03H 7/48*           (2006.01)
    *H03H 7/21*           (2006.01)
    *H04B 15/02*         (2006.01)

(52) U.S. Cl.
    CPC . *H03H 7/21* (2013.01); *H04B 15/02* (2013.01)

(58) Field of Classification Search
    USPC .......................................................... 333/132
    See application file for complete search history.

(56) References Cited

U.S. PATENT DOCUMENTS

| | | | |
|---|---|---|---|
| 4,768,000 A | 8/1988 | Pavio, Jr. et al. | |
| 6,768,364 B2 | 7/2004 | Wang | |
| 6,959,180 B2 | 10/2005 | Ji | |
| 7,271,647 B2 | 9/2007 | Cao et al. | |
| 7,308,244 B2 | 12/2007 | Chang et al. | |
| 7,420,423 B2 | 9/2008 | Lee et al. | |
| 7,890,076 B2 | 2/2011 | Mattisson et al. | |
| 8,050,644 B1 | 11/2011 | Cosand et al. | |
| 8,760,209 B2 * | 6/2014 | Schell et al. | 327/237 |
| 2008/0094133 A1 | 4/2008 | Lim et al. | |
| 2011/0159834 A1 | 6/2011 | Salvi | |

OTHER PUBLICATIONS

Official Action for Taiwan Patent Application 103111909, dated Apr. 24, 2015, 5 pgs.
Behbahani, Farbod et al., "CMOS Mixers and Polyphase Filters for Large Image Rejection", IEEE Journal of Solid-State Circuits, vol. 36, No. 6, Jun. 2001, pp. 873-887.

* cited by examiner

*Primary Examiner* — Daniel Puentes
(74) *Attorney, Agent, or Firm* — Edward C. Kwok; Hogan Lovells US LLP

(57) ABSTRACT

A poly-phase filter receives inphase input signals I and $\bar{I}$ and quadrature input signals Q and $\bar{Q}$, and provides inphase output signals $I_{out}$ and $\bar{I}_{out}$ and quadrature output signals $Q_{out}$ and $\bar{Q}_{out}$. The capacitance of each variable capacitor connected to the terminals providing inphase output signals $I_{out}$ and $\bar{I}_{out}$ is and the capacitance of each variable capacitor connected to the terminals providing quadrature output signals $\bar{Q}_{out}$ and $Q_{out}$, are different in value, and preferably by twice a predetermined value. This is because adjustment to the capacitance values may be made to each set of variable capacitors by the predetermined value.

5 Claims, 2 Drawing Sheets

US 9,106,202 B2

POLY-PHASE FILTER WITH PHASE TUNING

CROSS REFERENCE TO RELATED APPLICATIONS

The present application is related to and claims priority of U.S. provisional patent application ("Copending Provisional Application"), Ser. No. 61/813,077, entitled "Poly-Phase Filter with Phase Tuning", filed on Apr. 17, 2013. The Copending Provisional Application is hereby incorporated by reference in its entirety. The present application is also related to copending U.S. patent application ("Related Application"), Ser. No. 14/061,479, entitled "Balun Mixer Circuits", filed on Oct. 23, 2013. The disclosure of the Related Application is also hereby incorporated by reference in its entirety.

BACKGROUND OF THE INVENTION

1. Field of the Invention

The present invention relates to analog filters. In particular, the present invention relates to analog filters suitable for use, for example, in mobile or telecommunications applications.

2. Discussion of the Related Art

From a fixed frequency sinusoidal source, an ideal poly-phase filter outputs equal-amplitude inphase (i.e., 0° and 180°) and quadrature (i.e., 90° and 270°) signals. However, in real implementations, due to source harmonics, circuit element mismatches, offset voltages and parasitic impedances, equal-amplitude inphase and quadrature output signals are difficult to achieve.

SUMMARY OF THE INVENTION

A poly-phase filter receives inphase input signals I and $\bar{I}$ and quadrature input signals Q and $\bar{Q}$, and provides inphase output signals $I_{out}$ and $\overline{I_{out}}$ and quadrature output signals $Q_{out}$ and $\overline{Q_{out}}$. According to one embodiment of the present invention, the capacitance of each variable capacitor connected to the terminals providing inphase output signals $I_{out}$ and $\overline{I_{out}}$ is and the capacitance of each variable capacitor connected to the terminals providing quadrature output signals $\overline{Q_{out}}$ and $Q_{out}$, are different in value, and preferably by twice a predetermined value. This is because adjustment to the capacitance values may be made to each set of variable capacitors by the predetermined value. For example, when an adjustment is made to the phase among the output signals $I_{out}$, $\overline{I_{out}}$, $Q_{out}$ and $\overline{Q_{out}}$, adjustment is made by increasing ΔC amount of capacitance to the variable capacitors associated with output signals $I_{out}$ and $\overline{I_{out}}$, while decreasing ΔC amount of capacitance to the variable capacitors associated with output signals $Q_{out}$, and $\overline{Q_{out}}$, or vice versa.

The present invention is better understood upon consideration of the detailed description below in conjunction with the accompanying drawings.

BRIEF DESCRIPTION OF THE PREFERRED EMBODIMENTS

Figure 3:
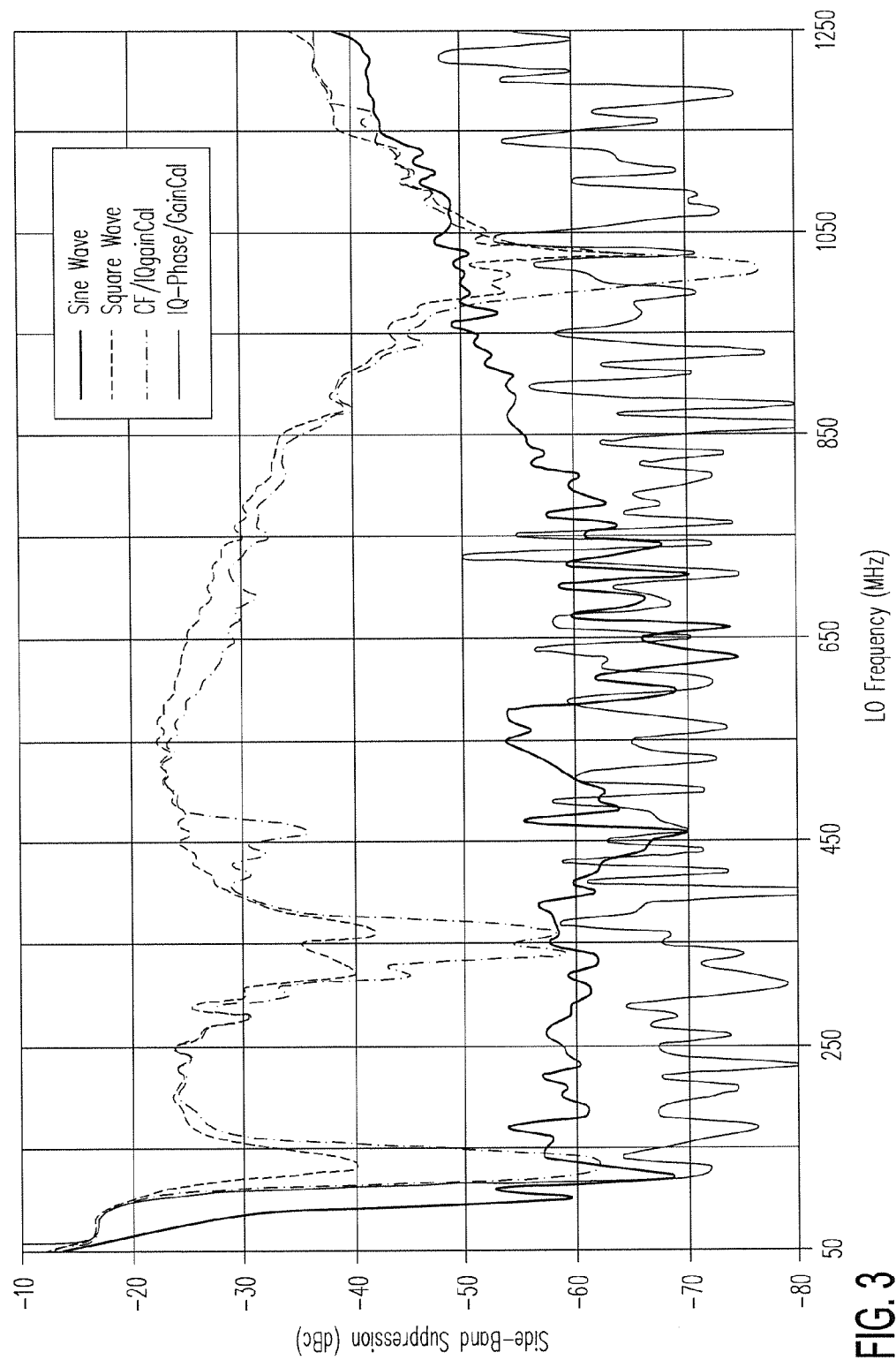

FIG. 3 shows side-band suppressions by a poly-phase filter of the present invention as a function of local oscillator (LO) frequency, as implemented in a balun mixer circuit (e.g., circuit 600 in FIG. 6 of the Related Application) and driven by a sine-wave LO signal, a square-wave LO signal, a square-wave LO signal with the center frequency and I/Q gain optimized, and a square-wave LO signal with I/Q phase and I/Q gain optimized.

DETAILED DESCRIPTION OF THE PREFERRED EMBODIMENT

Figure 1:
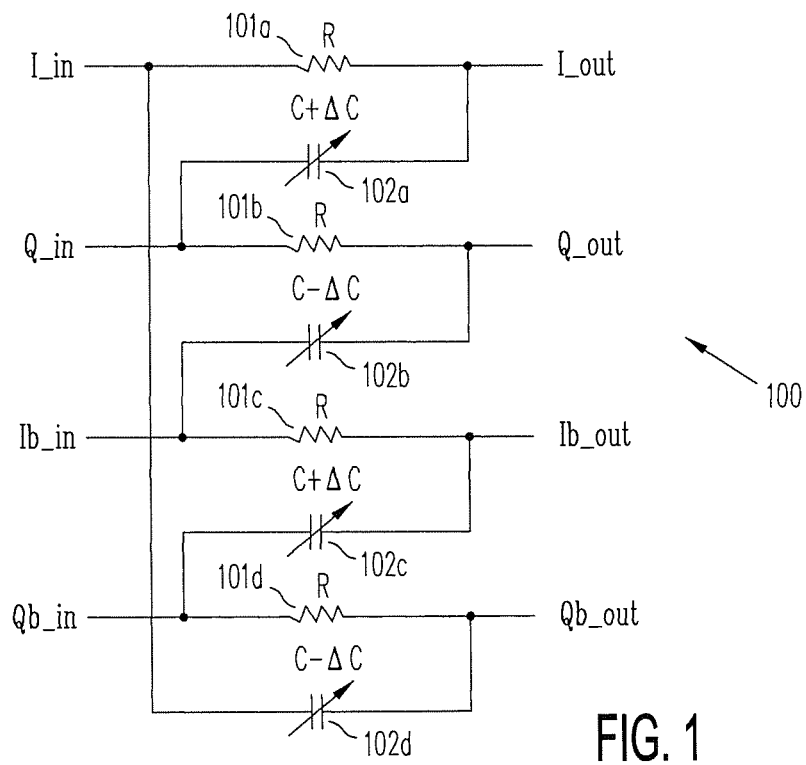
FIG. 1 is a schematic diagram showing poly-phase filter 100 with phase tuning, in accordance with one embodiment of the present invention.

FIG. 1 is a schematic diagram showing poly-phase filter 100 with phase tuning, in accordance with one embodiment of the present invention. As shown in FIG. 1, poly-phase filter 100 receives input signals I, Q, $\bar{I}$, and $\bar{Q}$, which are ideally analog signals representing 0°, 90°, 180°, and 270° phases of the same signal. Poly-phase filter 100 provides corresponding output signals $I_{out}$, $Q_{out}$, $\overline{I_{out}}$, and $\overline{Q_{out}}$ (representing 0°, 90°, 180°, and 270° phases of the output signal). Poly-phase filter 100 includes variable resistors 101a, 101b, 101c and 101d and variable capacitors 102a, 102b, 102c and 102d. In an integrated circuit implementation, for example, variable capacitors 102a, 102b, 102c and 102d may be implemented, for example, using MOS capacitor arrays or binary-weighted capacitor arrays with MOS switches. Likewise, the resistance of each variable resistor may be selected from, for example, polysilicon resistor strings. The resistance and capacitance values for variable resistors 101a-101d and variable capacitors 102a-102d may be selected by programming at a final manufacturing step (e.g., wafer sort step), or by an externally accessible bus (e.g., a 3-wire serial bus, such as SPI or I²C).

According to one embodiment of the present invention, in order to adjust the phase separations between signals I, Q, $\bar{I}$, and $\bar{Q}$ while maintaining their amplitudes substantially the same, a phase adjustment is made by increasing variable capacitors 102a and 102c (i.e., those variable capacitors that are associated with inphase output signals $I_{out}$ and $\overline{I_{out}}$) each by an amount ΔC, and decreasing variable capacitors 102b and 102d (i.e., those variable capacitors that are associated with quadrature output signals $Q_{out}$ and $\overline{Q_{out}}$) each by the same amount ΔC.

To set two different capacitor array values, a digital bus accessing the capacitor arrays provides twice the number of bits relative to the prior art (e.g., poly-phase filter 250 in FIG. 3 of U.S. patent application publication 2008/0094133).

Likewise, adjustments may be applied to variable resistors 101a, 101b, 101c and 101d. For example, the resistance of each variable resistor connected to the terminals providing inphase output signals $I_{out}$ and $\overline{I_{out}}$ and the resistance of each variable resistor connected to the terminals providing quadrature output signals $\overline{Q_{out}}$ and $Q_{out}$, differs in value by twice ΔR, where ΔR is a integral multiple of a minimum increment in resistor value.

Figure 2:
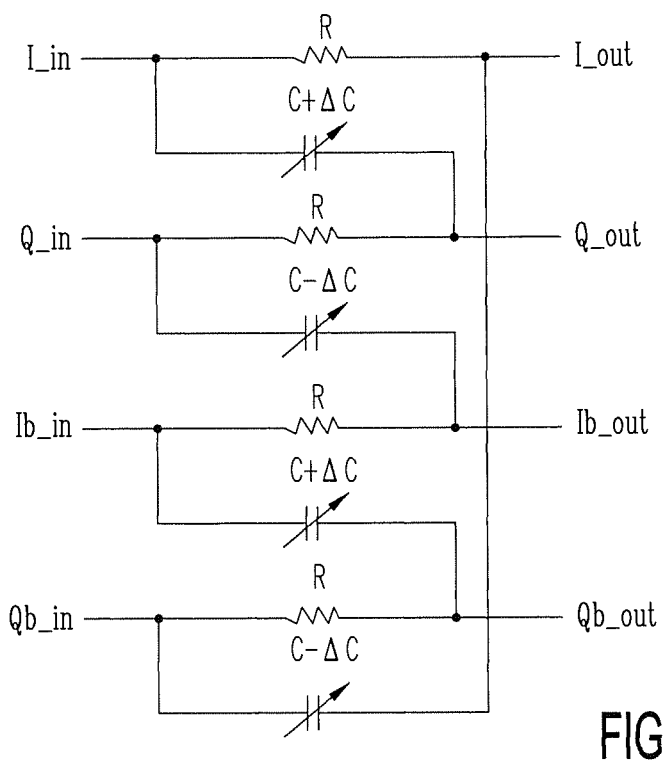
FIG. 2 is a schematic diagram showing an alternative implementation of poly-phase filter 100 with phase tuning, in accordance with one embodiment of the present invention.

FIG. 2 is a schematic diagram showing an alternative implementation of poly-phase filter 100 with phase tuning, in accordance with one embodiment of the present invention.

A poly-phase filter of the present invention may be used, for example, in the I-mixer and the Q-mixer in an I/Q modulator formed by a double-balanced image-reject mixer, such as circuit 600 in FIG. 6 of the Related Application. One figure of merit for an I/Q modulator is its side-band suppression (sometimes also referred to as "image rejection"). Typically the side-band suppression can be maximized by optimizing the I/Q phase error and the I/Q gain error (i.e., two variables to be optimized). For a prior art poly-phase filter (e.g., poly-phase filter 250 in FIG. 3 of U.S. patent application publication 2008/0094133), the optimization can be achieved by adjusting its center frequency, or by adjusting the I/Q gain by changing the relative gain between the I-mixer and the Q-mixer. The relative gain adjustment may be accomplished, for example, by changing the ratio between the degeneration resistors in the I-mixer and the Q-mixer.

FIG. 3 shows side-band suppressions by a poly-phase filter of the present invention as a function of local oscillator (LO) frequency, as implemented in a balun mixer circuit (e.g., circuit 600 in FIG. 6 of the Related Application) and driven by a sine-wave LO signal, a square-wave LO signal, a square-wave LO signal with the center frequency and I/Q gain optimized, and a square-wave LO signal with I/Q phase and IQ gain optimized. The center frequency of the poly-phase filter is set according to a fixed table (Center Frequency Table or CF-Table). The center frequency is a fixed value for each LO frequency chosen. As shown in FIG. 3, when the LO input signal is changed from a sine-wave signal to a square-wave signal, the side-band suppression is severely degraded, at the same center frequency value provided by the CF-table. The degradation is due to the third and higher harmonic contents of the square wave. The third harmonic causes a larger amplitude in the Q-channel than in the I-channel, which can cause a phase shift (See a discussion of this phenomenon, for example, in *LO Harmonic Effects on I/Q Balance and Sideband Suppression in I/Q Modulators*, Texas Instrument Application Report, May 2010).

As shown in FIG. 3, even after optimizing center frequency and I/Q gain, not much improvement in side-band suppression is observed using a square-wave LO signal (i.e., waveform CF/IQgainCal). However, when both I/Q phase and I/Q gain are optimized while maintaining the same center frequency and square-wave LO signal (i.e., waveform IQ-Phase/GainCal), side-band suppression is seen significantly improved. This result indicates that an I/Q phase setting can be very useful in optimizing side-band suppression. A poly-phase filter of the present invention is useful to achieve this optimization.

The above detailed description is provided to illustrate specific embodiments of the present invention and is not intended to be limiting. Numerous variations and modifications within the scope of the present invention are possible. The present invention is set forth in the accompanying claims.

I claim:

1. A poly-phase filter, comprising:
   terminals for receiving inphase input signals I and $\bar{I}$, and quadrature input signals Q and $\bar{Q}$;
   terminals for providing inphase output signals $I_{out}$ and $\overline{I_{out}}$, and quadrature output signals $Q_{out}$ and $\overline{Q_{out}}$;
   variable resistors connecting across the terminals for receiving inphase input signal I, quadrature input signal Q, inphase input signal $\bar{I}$, and quadrature input signal $\bar{Q}$, and the terminals for providing inphase output signal $I_{out}$, quadrature output signal $Q_{out}$, inphase output signal $\overline{I_{out}}$, and quadrature output signal $\overline{Q_{out}}$, respectively; and
   variable capacitors connecting across the terminals for receiving inphase input signal I, quadrature input signal Q, inphase input signal $\bar{I}$, and quadrature input signal $\bar{Q}$, and the terminals for providing quadrature output signal $\overline{Q_{out}}$, inphase output signal $I_{out}$, quadrature output signal $Q_{out}$, and inphase output signal $\overline{I_{out}}$, respectively, wherein each adjustment that increases or decreases the capacitance of each variable capacitor connected to the terminals providing inphase output signals $I_{out}$ and $\overline{I_{out}}$ correspondingly decreases or increases by an equal amount the capacitance of each variable capacitor connected to the terminals providing quadrature output signals $\overline{Q_{out}}$ and $Q_{out}$.

2. The poly-phase filter of claim 1, wherein the capacitance of each variable capacitor connected to the terminals providing inphase output signals $I_{out}$ and $\overline{I_{out}}$ differs from the capacitance of each variable capacitor connected to the terminals providing quadrature output signals $\overline{Q_{out}}$ and $Q_{out}$ by twice a predetermined amount.

3. The poly-phase filter of claim 1, wherein the resistance of each variable resistor connected to the terminals providing inphase output signals $I_{out}$ and $\overline{I_{out}}$ and the resistance of each variable resistor connected to the terminals providing quadrature output signals $\overline{Q_{out}}$ and $Q_{out}$ are different in value.

4. A poly-phase filter, comprising:
   terminals for receiving inphase input signals I and $\bar{I}$, and quadrature input signals Q and $\bar{Q}$;
   terminals for providing inphase output signals $I_{out}$ and $\overline{I_{out}}$, and quadrature output signals $Q_{out}$ and $\overline{Q_{out}}$;
   variable resistors connecting across the terminals for receiving inphase input signal I, quadrature input signal Q, inphase input signal $\bar{I}$, and quadrature input signal $\bar{Q}$, and the terminals for providing inphase output signal $I_{out}$, quadrature output signal $Q_{out}$, inphase output signal $\overline{I_{out}}$, and quadrature output signal $\overline{Q_{out}}$, respectively, wherein each adjustment increases or decreases the resistance of each variable resistor connected to the terminals providing inphase output signals $I_{out}$ and $\overline{I_{out}}$ correspondingly decreases or increases by an equal amount the resistance of each variable resistor connected to the terminals providing quadrature output signals $\overline{Q_{out}}$ and $Q_{out}$, are different in value; and
   variable capacitors connecting across the terminals for receiving for receiving inphase input signal I, quadrature input signal Q, inphase input signal $\bar{I}$, and quadrature input signal $\bar{Q}$, and the terminals for providing quadrature output signal $\overline{Q_{out}}$, inphase output signal $I_{out}$, quadrature output signal $Q_{out}$, and inphase output signal $\overline{I_{out}}$, respectively.

5. The poly-phase filter of claim 4, wherein the resistance of each variable resistor connected to the terminals providing inphase output signals $I_{out}$ and $\overline{I_{out}}$ and the resistance of each variable resistor connected to the terminals providing quadrature output signals $\overline{Q_{out}}$ and $Q_{out}$, differs in value by twice a predetermined amount.

* * * * *